(12) United States Patent
Mori et al.

(10) Patent No.: US 8,351,472 B2
(45) Date of Patent: Jan. 8, 2013

(54) SEMICONDUCTOR LIGHT EMITTING ELEMENT AND TUNABLE WAVELENGTH LASER LIGHT SOURCE

(75) Inventors: Hiroshi Mori, Kawasaki (JP); Takashi Nakayama, Yamato (JP); Atsushi Yamada, Atsugi (JP)

(73) Assignee: Anritsu Corporation, Atsugi-shi (JP)

( * ) Notice: Subject to any disclaimer, the term of this patent is extended or adjusted under 35 U.S.C. 154(b) by 146 days.

(21) Appl. No.: 12/298,971

(22) PCT Filed: Apr. 20, 2007

(86) PCT No.: PCT/JP2007/058586
§ 371 (c)(1),
(2), (4) Date: Nov. 3, 2009

(87) PCT Pub. No.: WO2007/129544
PCT Pub. Date: Nov. 15, 2007

(65) Prior Publication Data
US 2011/0096799 A1 Apr. 28, 2011

(30) Foreign Application Priority Data
May 1, 2006 (JP) .................................. 2006-127427

(51) Int. Cl.
*H01S 5/02* (2006.01)
*H01S 5/22* (2006.01)
*H01S 5/227* (2006.01)
(52) U.S. Cl. ....... 372/20; 372/34; 372/43.01; 372/44.01
(58) Field of Classification Search .................... 372/20, 372/34, 43.01, 44.01
See application file for complete search history.

(56) References Cited

U.S. PATENT DOCUMENTS
5,680,411 A * 10/1997 Ramdane et al. ............ 372/50.1
(Continued)

FOREIGN PATENT DOCUMENTS
EP 0 465 914 A2 1/1992
(Continued)

OTHER PUBLICATIONS
European Search Report issued in corresponding EP App. No. 97 74 2022, mailed Dec. 7, 2011.

*Primary Examiner* — Jessica Stultz
*Assistant Examiner* — Michael Carter
(74) *Attorney, Agent, or Firm* — Greer, Burns & Crain, Ltd.

(57) ABSTRACT

The present invention provides a semiconductor light emitting element that can obtain oscillation at desired wavelengths. The semiconductor light emitting element comprises a semiconductor substrate 11, an active layer 12 for emitting and propagating light, which is formed in a stripe shape above the semiconductor substrate 11, buried layers 13a, 13b formed on both lateral sides of the active layer 12, a cladding layer 16 formed above the active layer 12 and the buried layers 13a, 13b, a first electrode 17a formed above the cladding layer 16, and a second electrode 17b formed below the semiconductor substrate 11. The active layer 12 opens on one end facet 14a among the two end facets formed by cleavage so that the active layer 12 makes a predetermined angle to the normal direction of the one end facet 14a. A partially heating means 15 for heating a predetermined length portion of the active layer 12 along the direction of light propagation is formed on a first electrode at a position thermally isolated from the one end facet 14a.

5 Claims, 6 Drawing Sheets

U.S. PATENT DOCUMENTS

| | | | |
|---|---|---|---|
| 5,870,417 A | 2/1999 | Verdiell et al. | |
| 5,978,400 A | 11/1999 | Campbell et al. | |
| 6,091,755 A | 7/2000 | Sanders et al. | |
| 6,580,734 B1 * | 6/2003 | Zimmermann | 372/29.02 |
| 6,700,910 B1 * | 3/2004 | Aoki et al. | 372/43.01 |
| 2002/0090011 A1 * | 7/2002 | Pezeshki et al. | 372/20 |
| 2005/0201440 A1 * | 9/2005 | Asano | 372/43.01 |
| 2005/0213618 A1 | 9/2005 | Sochava et al. | |

FOREIGN PATENT DOCUMENTS

| | | |
|---|---|---|
| JP | A 6-5980 | 1/1994 |
| JP | A 6-97601 | 4/1994 |
| JP | A 7-335965 | 12/1995 |
| JP | A 2003-142777 | 5/2003 |
| JP | A 2005-286288 | 10/2005 |

* cited by examiner

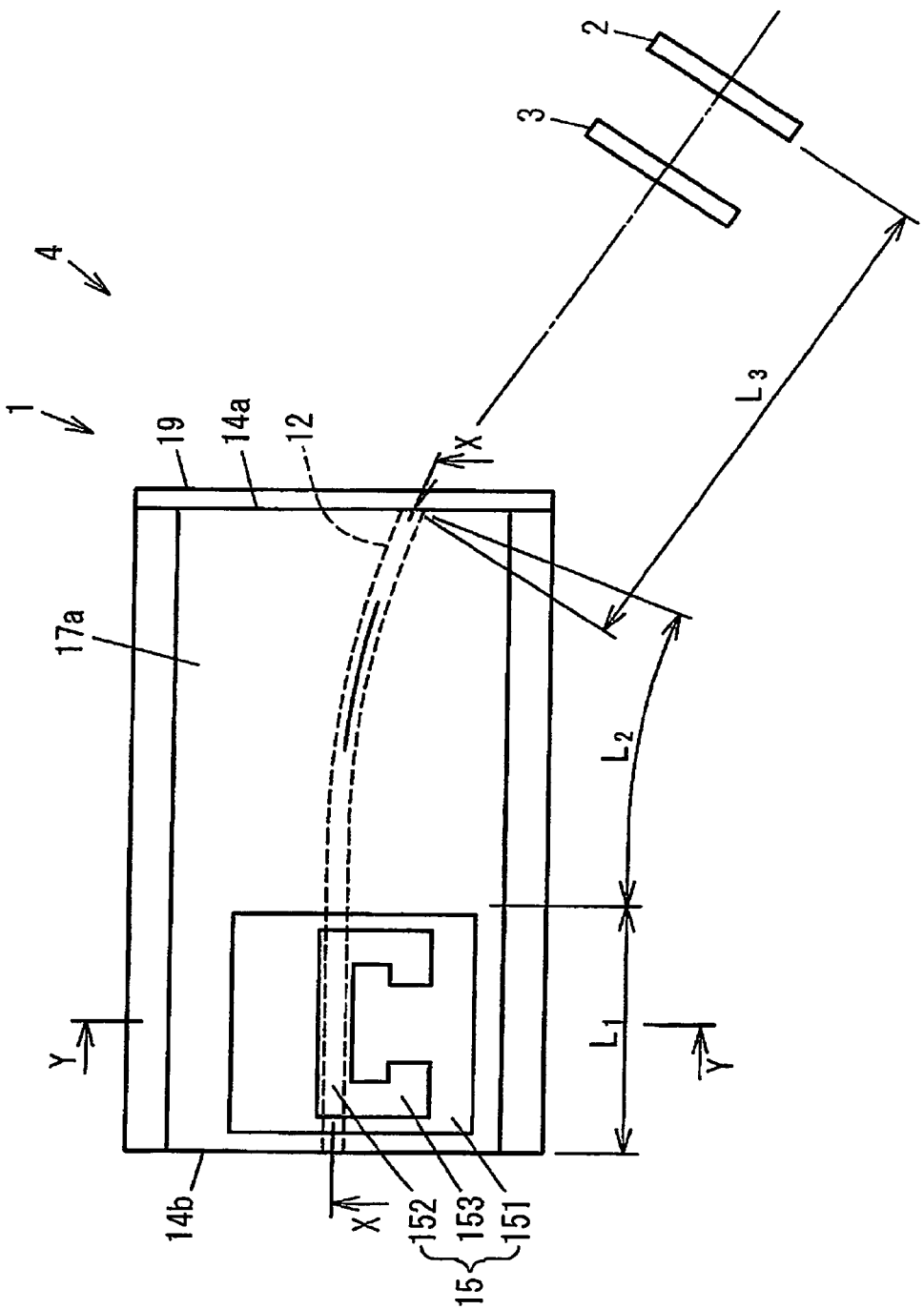

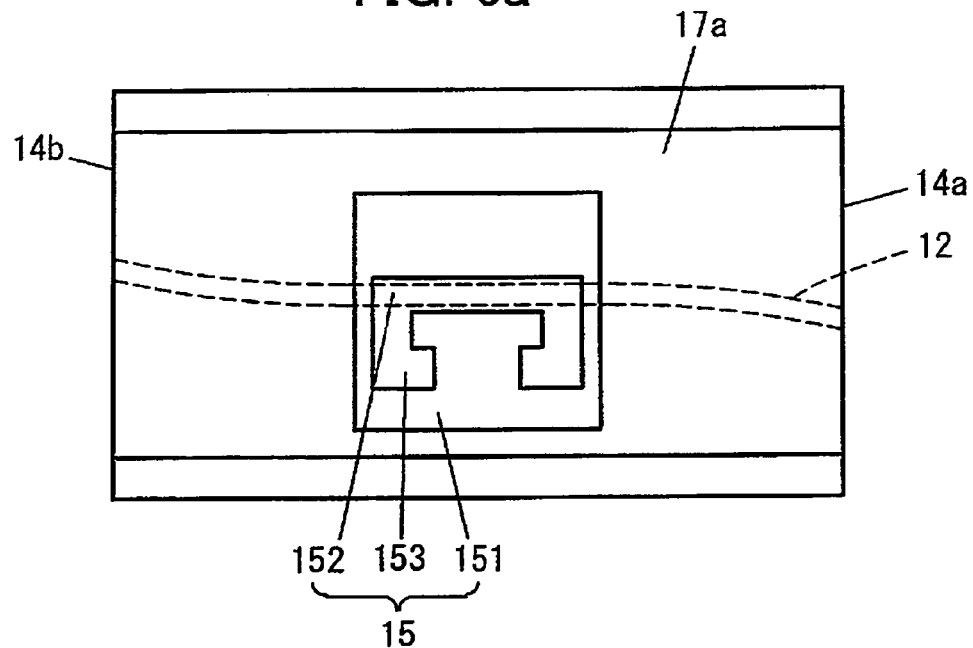
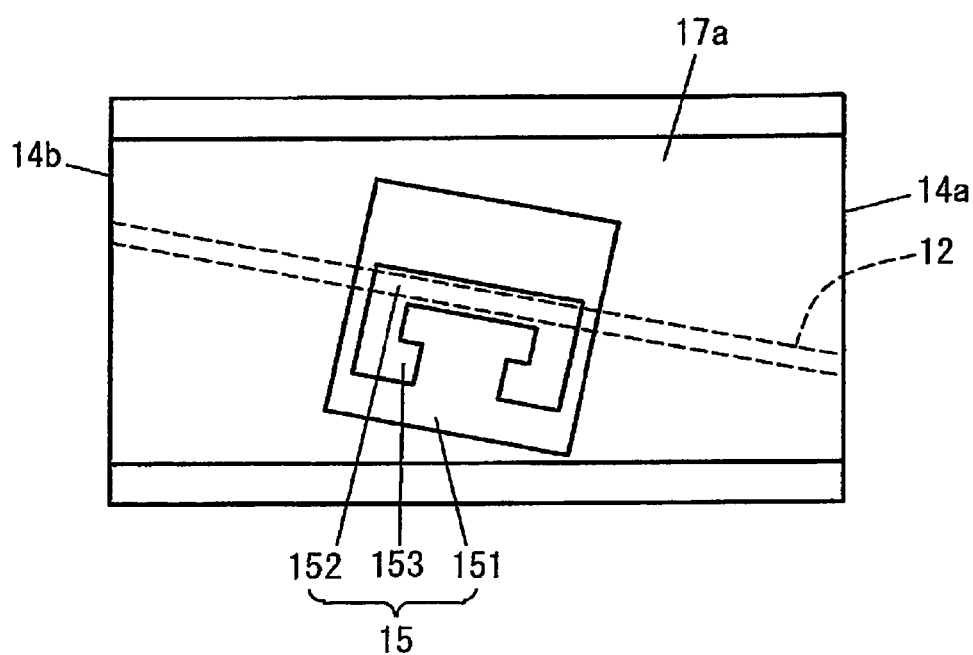

SEMICONDUCTOR LIGHT EMITTING ELEMENT AND TUNABLE WAVELENGTH LASER LIGHT SOURCE

This application is a U.S. National Phase under 35 U.S.C.§371 of International Application No. PCT/JP2007/058586, filed Apr. 20, 2007.

BACKGROUND OF THE INVENTION

1. Field of the Invention

The present invention relates to a semiconductor light emitting element, especially, relates to a tunable wavelength laser light source enabling laser oscillation at desired wavelengths, and a super luminescent diode enabling the expansion of the half width of the emission spectrum.

2. Prior Art

With the widespread use of multimedia, several kinds of methods for increasing the capacity of optical communication systems have been proposed.

One example of the methods is a wavelength division multiplexing (WDM) communication using erbium doped fiber amplifiers (EDFAs) or Raman amplifiers. The WDM communication system can increase the capacity of the communication system drastically without increasing the number of optical fibers installed, because of the fact that the system propagates information by using a plurality of lights having different wavelengths.

In the above mentioned WDM communication system, a signal light source comprises a plurality of distributed feedback laser diodes (DFB-LDs) where each DFB-LD oscillates at one of several specific wavelengths that are different from each other, corresponding to each communication channel. In order to improve the reliability of the communication system, however, it is necessary to install spare DFB-LDs for all the DFB-LDs for backup purposes, resulting in higher cost.

Therefore, there has been a need for a tunable wavelength laser enabling laser oscillation at desired wavelengths in order to back up all the channels with less number of the tunable wavelength laser than the number of the DFB-LDs.

The applicant has proposed a tunable wavelength laser available for the above mentioned purpose (see, for example, Japanese published unexamined application No. H06-5980).

The tunable wavelength laser according to the above proposal has two regions aligned on the resonant axis, which are a light emitting region and a wavelength controlling region having a heating means. The oscillation wavelength is controlled by heating the wavelength controlling region from the heating means.

The tunable wavelength laser according to the above proposal, however, is a monolithic laser, which has a phase controlling region and a distributed Bragg reflector (DBR) region having a grating as the wavelength controlling region. Therefore, the wavelength change is restricted by the refractive index change, resulting in a maximum wavelength change of about 15 nm in practical use. Because of the fact that the tunable wavelength laser comprises the coupling of an active waveguide and a passive waveguide, there are some problems such that the number of crystal growth processes is large, the manufacturing cost is high, and the yield is poor.

A tunable wavelength light source using an external cavity laser device has been widely used mainly as a light source for measurement purposes (see, for example, Japanese published unexamined application No. 1107-335965).

The tunable wavelength light source according to the above proposal has a laser device having two regions aligned on the resonant axis, which are an active region and a phase controlling region, and a grating which can control the diffraction wavelength. The oscillation wavelength is controlled by controlling the reflection wavelength of the grating and the refractive index of the phase controlling region.

The tunable wavelength light source according to the above proposal, however, also has some problems such that the crystal growth of the active waveguide and the passive waveguide needs to be performed separately, ensuring high enough resistance between electrodes is difficult, the line width of the emission spectrum broadens, and the reliability of the control of the refractive index of the passive waveguide is not established.

That is, because of the fact that the phase controlling region comprises a semiconductor having a larger band gap energy than that of the active region, the crystal growth of the active waveguide and the passive waveguide needs to be performed separately, resulting in the increase in the number of crystal growth processes.

Since enhancing the resistance between electrodes is difficult, interference between the current injected into the phase controlling region and the current injected into the active region is inevitable.

Due to the fluctuation of the refractive index in the phase controlling region, resulting from the shot noise caused by free carriers, the expansion of the line width of the emission spectrum is inevitable. The tunable wavelength light source according to the above proposal also has a problem that increasing the output is difficult because of the fact that the light is absorbed due to the free carrier absorption.

As for the tunable wavelength light source according to the above proposal, the refractive index of the phase controlling region is changed due to the plasma effect caused by the injection of the current into the phase controlling region. It has been known that the device easily deteriorates when the condition of high carrier density continues for long time, therefore ensuring the reliability of the device is difficult.

The present invention to solve the above described problems, therefore, aims to provide a semiconductor light emitting element which can control the phase when applied to an external cavity laser, and can broaden the width of emission spectrum when applied to a super luminescent diode.

SUMMARY OF THE INVENTION

In order to solve the above described problems, a semiconductor light emitting element according to the present invention defined in claim 1 comprises a semiconductor substrate, an active layer for emitting and propagating light, said active layer being formed in a stripe shape above said semiconductor substrate, buried layers formed on both lateral sides of said active layer, a cladding layer formed above said active layer and said buried layers, a first electrode formed above said cladding layer, and a second electrode formed below said semiconductor substrate, wherein said active layer opens on two end facets formed by cleavage, said active layer providing optical gain over the entire length between said two end facets, said active layer making a predetermined angle to a normal direction of one end facet among said two end facets, said light being emitted from said one end facet, said semiconductor light emitting element further comprising a partially heating means for heating a predetermined length portion of said active layer along a direction of light propagation, said partially heating means being formed on said first electrode at a position closer to the other end facet than to said one end facet, heat generated by said partially heating means being conducted to said semiconductor substrate in a direction of thickness of said semiconductor light emitting element.

According to the above constitution, by supplying electrical power to the partially heating means, it becomes possible to control the phase of the light emitted from the one end facet without changing the emission angle of the light.

A semiconductor light emitting element according to the present invention defined in claim 2 comprises a semiconductor substrate, an active layer formed above said semiconductor substrate, a cladding layer formed above said active layer, an insulating film formed above said cladding layer, a first electrode formed above said insulating film, a second electrode formed below said semiconductor substrate, and a ridge section formed above said active layer, wherein said active layer opens on two end facets formed by cleavage, said active layer providing optical gain over the entire length between said two end facets, said active layer making a predetermined angle to a normal direction of one end facet among said two end facets, said light being emitted from said one end facet, said semiconductor light emitting element further comprising a partially heating means for heating a predetermined length portion of said active layer along a direction of light propagation, said partially heating means being formed on said first electrode at a position closer to the other end facet than to said one end facet, heat generated by said partially heating means being conducted to said semiconductor substrate in a direction of thickness of said semiconductor light emitting element.

According to the above constitution, by supplying electrical power to the partially heating means, it becomes possible to heat the predetermined length portion of the active layer along the direction of light propagation more effectively, and to control the phase of the light emitted from the one end facet without changing the emission angle of the light.

A semiconductor light emitting element according to the present invention defined in claim 3 provides said partially heating means comprises an insulating film, a thin film resistor formed on said insulating film, and at least two terminal sections for supplying electrical power to said thin film resistor.

According to the above constitution, it becomes possible to heat the predetermined length portion of the active layer along the direction of light propagation.

A semiconductor light emitting element according to the present invention defined in claim 4 provides said active layer opens perpendicularly on the other end facet among two end facets formed by cleavage.

A tunable wavelength laser light source according to the present invention defined in claim 6 comprises a semiconductor light emitting element as set forth in claim 1 or 2, an anti-reflection film formed on said one end facet of said semiconductor light emitting element, an optical feedback means aligned on an optical axis of light emitted from said one end facet so as to feedback said light emitted from said one end facet to said one end facet, and a wavelength selecting means for selecting an oscillation wavelength of a laser cavity comprised of said semiconductor light emitting element and said optical feedback means, wherein said oscillation wavelength of said laser cavity is changed in response to electrical power supplied to said thin film resistor from said at least two terminal sections and a wavelength selected by said wavelength selecting means.

According to the above constitution, it becomes possible to form an external laser cavity having high wavelength selectivity.

The present invention can provide a semiconductor light emitting element which can control the phase when applied to an external cavity laser, and can broaden the width of emission spectrum when applied to a super luminescent diode by including the partially heating means for heating the predetermined length portion of the active layer along the direction of light propagation.

DESCRIPTION OF THE REFERENCE NUMERALS

1: semiconductor light emitting element
2: external mirror
3: optical band pass filter
4: external cavity laser
11, 51: semiconductor substrate
12, 53: active layer
13a, 13b: buried layer
14a, 58a: one end facet
14b, 58b: other end facet
15, 59: partially heating means
16, 54: cladding layer
17a, 57a: first electrode
17b, 57b: second electrode
18: recessed section
19: anti-reflection film
56: first insulating film
151, 591: insulating film
152, 592: thin film resistor
153, 593: terminal section

BRIEF DESCRIPTION OF THE DRAWINGS

FIG. 2 shows a diagram of the external cavity laser having the semiconductor light emitting element according to the present invention;

FIGS. 6a and 6b show a plan view of the fourth embodiment of the semiconductor light emitting element according to the present invention.

DETAILED DESCRIPTION OF THE PREFERRED EMBODIMENTS

Hereinafter, preferred embodiments of a semiconductor light emitting element according to the present invention will be concretely described with reference to the drawings.

First Embodiment

The first embodiment of a semiconductor light emitting element according to the present invention is shown in FIG. 1.

Figure 1A:
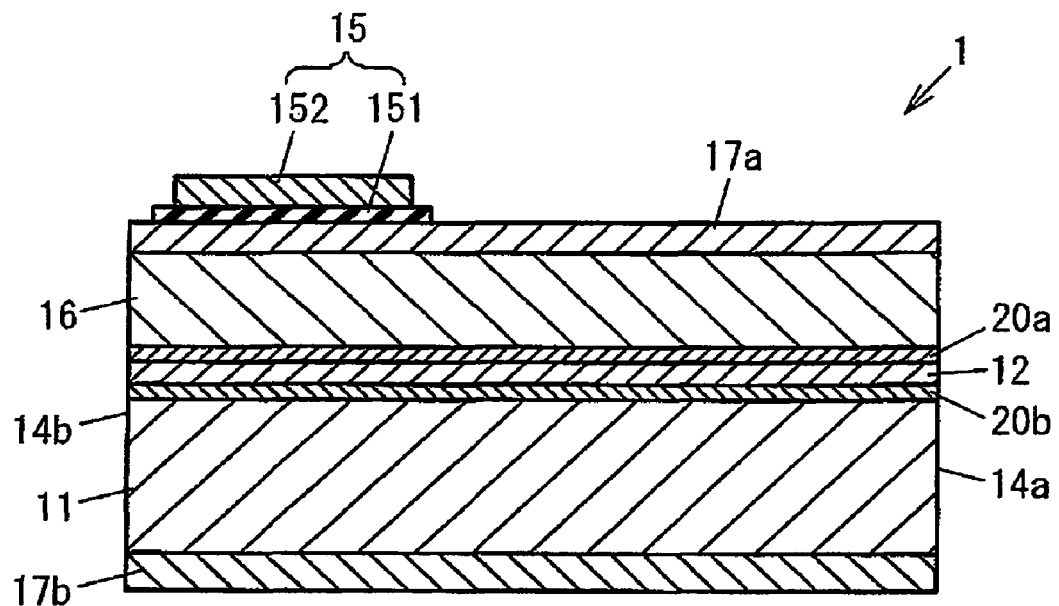
FIGS. 1a and 1b show cross-sectional views of the first embodiment of the semiconductor light emitting element according to the present invention, taken along the line X-X and Y-Y in FIG. 2.
Figure 1B:
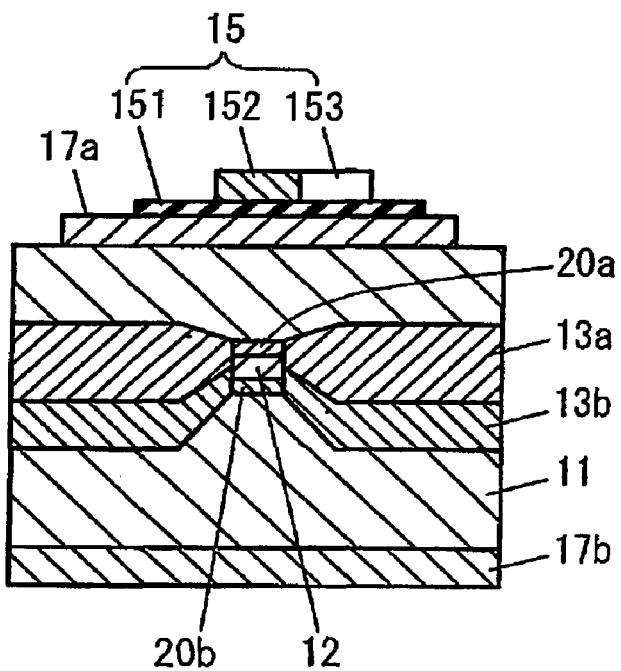

FIG. 1a is a cross-sectional view taken along the line X-X in FIG. 2, FIG. 1b is a cross-sectional view taken along the line Y-Y in FIG. 2.

The first embodiment of the semiconductor light emitting element 1 comprises a semiconductor substrate 11, an active layer 12 for emitting and propagating light; which is formed in a stripe shape above the semiconductor substrate 11, separate confinement heterostructure (SCH) layers 20a, 20b formed above and below the active layer 12, buried layers 13a, 13b formed on both lateral sides of the SCH layers 20a, 20b and the active layer 12, a cladding layer 16 formed above the SCH layers 20a, 20b and the buried layer 13a, a first electrode 17a formed above the cladding layer 16, and a second electrode 17b formed below the semiconductor substrate 11.

The two end facets perpendicular to the length direction of the semiconductor light emitting element 1 according to the present invention are formed by cleavage. The active layer 12 opens on one end facet 14a among the two end facets formed by cleavage so that the active layer 12 makes a predetermined angle to the normal direction of the one end facet 14a. The active layer 12 opens perpendicularly on the other end facet 14b among the two end facets. A partially heating means 15 for heating a predetermined length portion of the active layer 12 along the direction of light propagation is formed on a first electrode at a position thermally isolated from the one end facet 14a and is close to the other end facet 14b.

The reflectivity at the one end facet 14a can be lowered by increasing the above mentioned predetermined angle unless the predetermined angle exceeds the angle of total reflection. However, it is difficult to form an external laser cavity when the emission angle of the light emitted from the one end facet 14a is too large. The emission angle is generally set to about 20 degrees, resulting in the predetermined angle of 5 to 7 degrees.

Note that the active layer 12 can comprise a multiple quantum well structure. Moreover, a contact layer can be formed between the cladding layer 16 and the first electrode 17a. Those skilled in the art are able to design such structures arbitrarily.

The partially heating means 15 comprises an insulating film 151, a thin film resistor 152 formed on the insulating film 151, and at least two terminal sections 153 for supplying electrical power to the thin film resistor 152.

Examples of materials which can be used for the insulating film include $S_iO_2$ and $S_iN_x$. The insulation quality deteriorates when the thickness of the insulating film is too thin, while the thermal resistance increases when the thickness of the insulating film is too thick. Therefore the thickness of the insulating film preferably ranges from about 50 nm to about 500 nm. Any metallic materials can be used for the thin film resistor, but the preferred materials are, for example, Au, Pt, which are hard to oxidize, and tantalum nitride, which has weak temperature dependence. It is desirable that Au is formed on the surface of the terminal sections 153, since a wire bonding process is carried out on the terminal sections 153.

FIG. 2 shows a diagram of an external cavity laser 4 as a tunable wavelength laser light source having the semiconductor light emitting element 1 according to the present invention. An anti-reflection film 19 is formed on the one end facet 14a. An external mirror 2 as an optical feedback means is disposed outside of the semiconductor light emitting element 1, so as to feedback the light emitted from the one end facet 14a to the other end facet 14b. An optical band pass filter 3 as a wavelength selecting means is aligned on the optical axis of the one end facet 14a and the external mirror 2. The output light of the external cavity laser 4 is the light emitted from the other end facet 14b on which the active layer 12 opens perpendicularly.

In this configuration, laser oscillation occurs as the light oscillates between the other end facet 14b and the external mirror 2. A single longitudinal mode is selected by the optical band pass filter 3. The oscillation wavelength changes discretely by tuning the output wavelength of the optical band pass filter 3. By supplying electrical power to the partially heating means 15 so that the partially heating means 15 heats the active layer partially and that the phase of the light is shifted, it becomes possible to obtain oscillation at desired oscillation wavelengths.

In this embodiment, the simple mirror and the optical band pass filter are employed as the optical feedback means and the wavelength selecting means respectively, however, the function of both the optical feedback means and the wavelength selecting means may be formed by a grating having wavelength selectivity, a liquid crystal based tunable mirror, and so on.

Equation 1 describes the oscillation condition of the above mentioned external cavity laser 4.

$$\phi = 2\pi m$$

$\phi$ is the phase of laser light $m$ is an integer  (Equation 1)

By introducing the propagation constant β of light, Equation 1 becomes Equation 2.

$$\phi = 2\sum_{i=1}^{3} \beta_i L_i$$

$$\beta_i = \frac{2\pi n_{eq,i}}{\lambda}$$  (Equation 2)

$n_{eq,i}$ is the equivalent index in Region i $L_1$ is the length of Region 1 where Region 1 represents the predetermined length portion of the active layer 12

$L_2$ is the length of Region 2 along the optical axis of the active layer 12 where Region 2 represents the active layer 12 except for the predetermined length portion $L_3$ is the length of Region 3 where Region 3 represents the region from the facet 14a of the semiconductor light emitting element 1 to the external mirror 2

Therefore, the wavelength $\lambda_m$ of light in the m-th mode is given in Equation 3.

$$\lambda_m = \frac{2}{m}\sum_{i=1}^{3} n_{eq,i} L_i$$  (Equation 3)

Therefore, a wavelength change $\Delta\lambda$ due to the equivalent index change $\Delta n_{eq,1}$ in the predetermined length portion of the active layer 12, which is generated by heating from the partially heating means 15, is given in Equation 4.

$$\Delta\lambda = \lambda \frac{\Delta n_{eq,1} L_1}{\sum_{i=1}^{3} n_{eq,i} L_i}$$  (Equation 4)

The longitudinal mode interval δλ, is given in Equation 5. The oscillation wavelength changes discretely by δλ, by tuning the output wavelength of the optical band pass filter 3.

$$\delta\lambda = \frac{\lambda^2}{2\sum_{i=1}^{3} n_{eq,i} L_i} \quad \text{(Equation 5)}$$

Therefore, it is necessary to satisfy the relationship of Equation 6 in order to change the oscillation wavelength continuously.

$$\Delta\lambda \geq \delta\lambda \quad \text{(Equation 6)}$$

It is known from experimental studies that the change $\Delta n_{eq,1}$ in the equivalent index $n_{eq,1}$ due to the temperature change is given in Equation 7.

$$\Delta n_{eq,1} \approx 0.0002 \Delta T \quad \text{(Equation 7)}$$

ΔT (° C.) is the temperature change in the predetermined length portion of the active layer 12

The relationship between the temperature change ΔT in the predetermined length portion of the active layer 12 and the wavelength change Δλ can be derived by substituting Equation 7 into Equation 4. For example, in the case where $$L_1 + L_2 = 1 \text{ mm}, L_3 = 5 \text{ mm}$$

$$n_{eq,1} = n_{eq,2} = 3.23, n_{eq,3} = 1$$

$$\lambda = 1.55 \text{ μm},$$

the longitudinal mode interval δλ is 0.14 nm (≈17 GHz).

Figure 3:
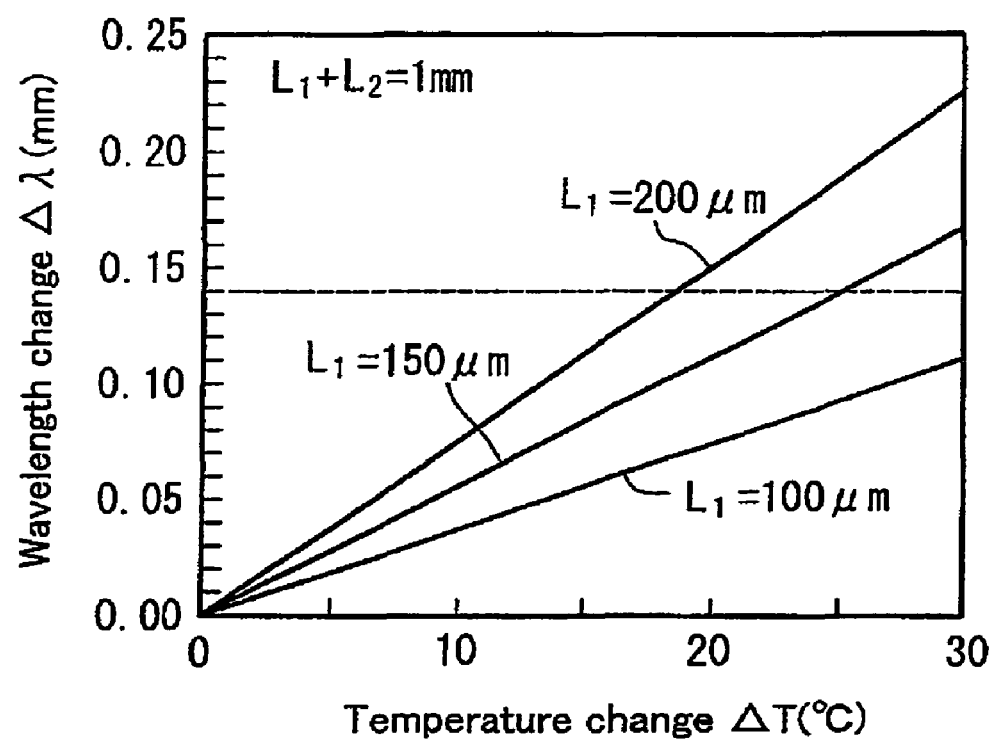
FIG. 3 shows a graph showing the relationship between the wavelength change $\Delta\lambda$ and the temperature change $\Delta T$ in the predetermined length portion of the active. layer of the semiconductor light emitting element according to the present invention.

FIG. 3 is a graph showing the relationship between the wavelength change Δλ and the temperature change ΔT in the predetermined length portion of the active layer 12 based on the above conditions and Equation 7, where the lengths $L_1$ of the predetermined length portion of the active layer 12 are 100 μm, 150 μm and 200 μm.

This graph shows that the wavelength change Δλ exceeds the longitudinal mode interval δλ by heating the predetermined length portion of the active layer 12 to a temperature of at least 25 degrees C. when the lengths $L_1$ of the predetermined length portion of the active layer 12 is 150 μm, and to a temperature of at least 18 degrees C. when the lengths $L_1$ of the predetermined length portion of the active layer 12 is 200 μm. Therefore, it becomes possible to select an oscillation wavelength between adjacent longitudinal modes continuously by heating the predetermined length portion of the active layer 12.

The semiconductor light emitting element 1 according to the present invention also can be used for a super luminescent diode (SLD). In this case, by reducing the energy gap of the predetermined length portion of the active layer 12 by heating, the emission spectrum is extended to longer wavelengths, resulting in a broadened half width of the emission spectrum.

As described above, by including the partially heating means for heating the predetermined length portion of the active layer along the direction of light propagation, the semiconductor light emitting element of the first embodiment of the present invention can change the wavelength change linearly with the temperature change when applied to an external cavity laser, and can broaden the width of emission spectrum when applied to an SLD.

Second Embodiment

The second embodiment of a semiconductor light emitting element according to the present invention is shown in FIG. 4.

Figures 4A, 4B:
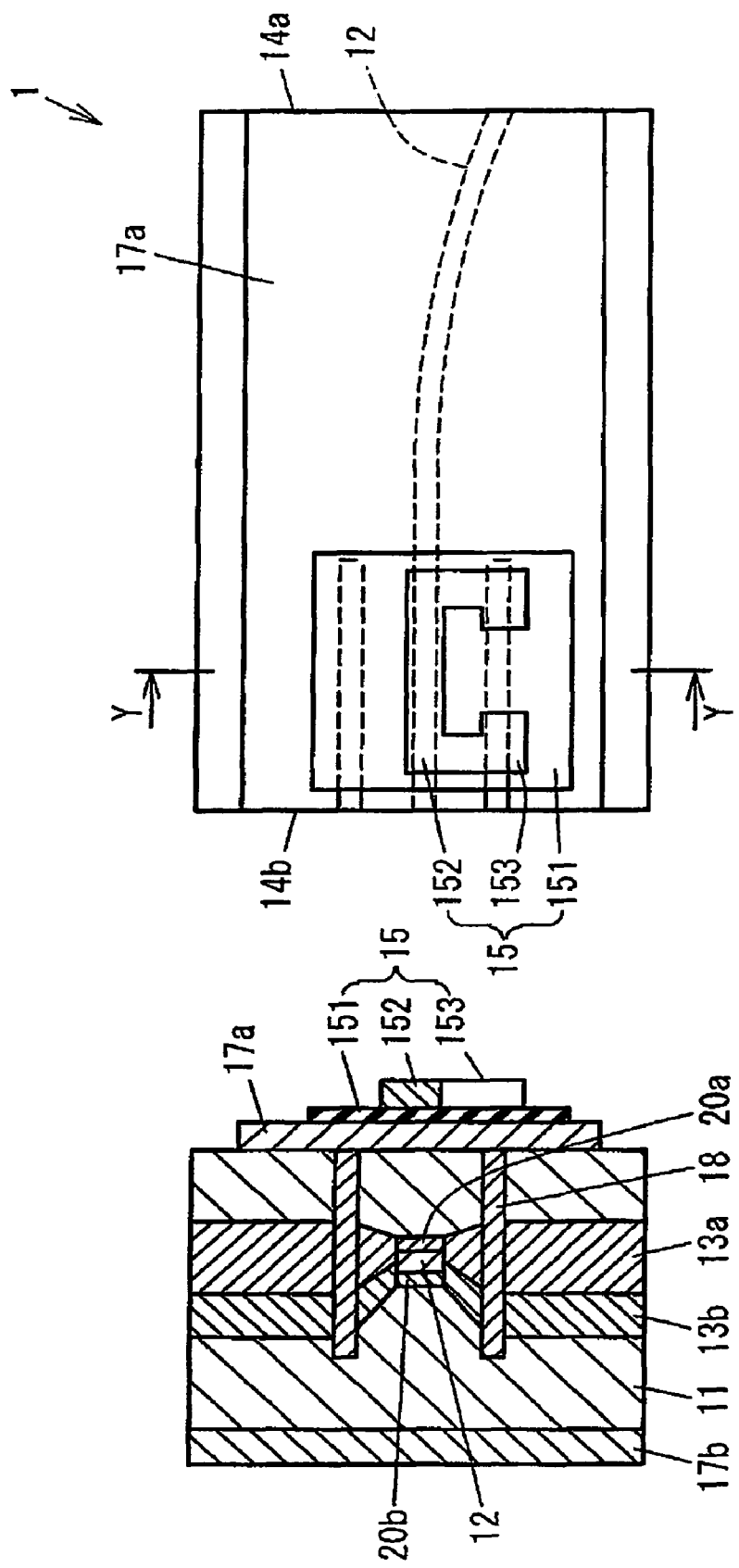
FIGS. 4a and 4b show a plan view and a cross-sectional view, which is taken along the line Y-Y, of the second embodiment of the semiconductor light emitting element according to the present invention.

FIG. 4a is a plan view and FIG. 4b is a cross-sectional view taken along the line Y-Y in FIG. 4a. As shown in those figures, the second embodiment of the semiconductor light emitting element comprises a pair of recessed sections 18 located in crystalline layers at both lateral sides of the predetermined length portion of the active layer, along the direction of light propagation, in addition to the components of the first embodiment.

The semiconductor light emitting element 1 can improve the heating efficiency of the predetermined length portion of the active layer by utilizing the air in the recessed sections 18 as a heat insulation layer which makes the heat generated at the thin film resistor 152 stored in and around the predetermined length portion of the active layer.

The distance between the pair of recessed sections 18 needs to be large enough to the spot size of the propagating light and to be small enough to the thickness of the semiconductor substrate 11 which serves as a heat path. For example, the distance between the active layer 12 and the recessed sections 18 is preferably between 5 μm and 50 μm.

The depth of the recessed sections 18 preferably reaches the bottom of the active layer 12 and is preferably between 2.5 μm and 5 μm. The recessed sections 18 may be filled with resinous materials such as polyimide. The resinous materials such as polyimide is easy to make the heat stored in and around the predetermined length portion of the active layer because those materials have lower thermal conductivity than that of semiconductor crystals. Furthermore, the formation of the insulating film 151 and the thin film resistor 152 become easy because the top surface of the recessed sections 18 is flat due to the filling of the recessed sections 18 with the resinous materials.

As described above, the semiconductor light emitting element of the second embodiment of the present invention can improve the heating efficiency of the predetermined length portion of the active layer by having recessed sections located in crystalline layers at both lateral sides of the predetermined length portion of the active layer, along the direction of light propagation.

Third Embodiment

Figure 5A:
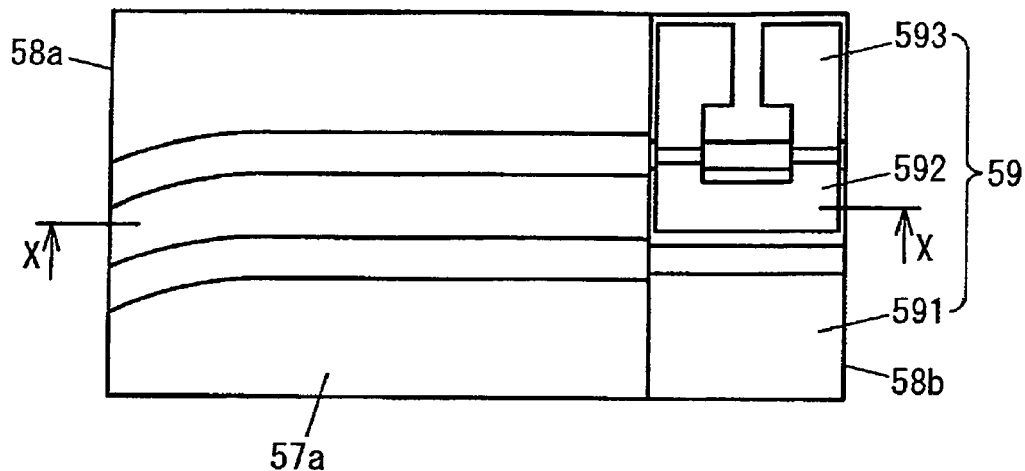
FIGS. 5a and 5b show a plan view and cross-sectional views, which are taken along the line X-X and Y-Y, of the third embodiment of the semiconductor light emitting element according to the present invention.
Figure 5B:
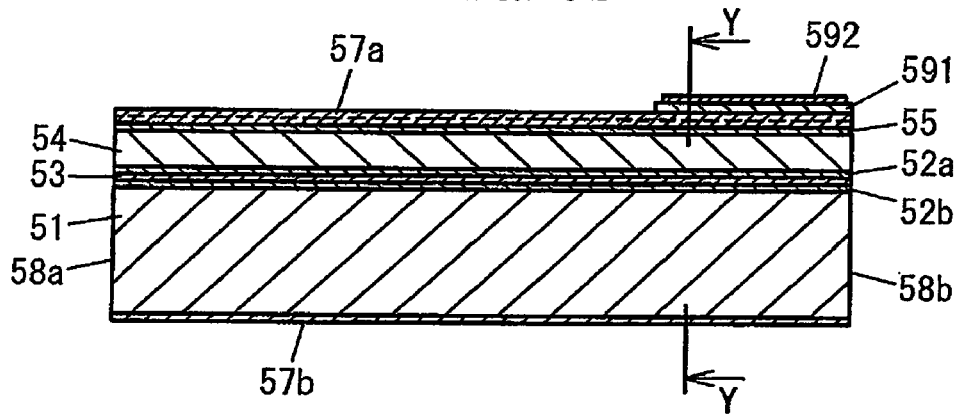
Figure 5C:
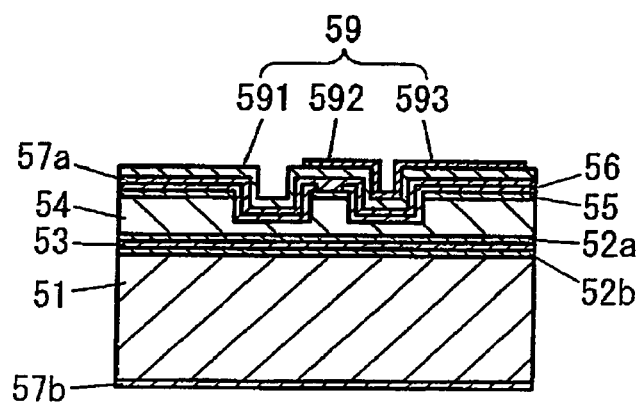

The third embodiment of a semiconductor light emitting element according to the present invention is shown in FIG. 5. FIG. 5a is a plan view, FIG. 5b is a cross-sectional view taken along the line X-X in FIG. 5a, and FIG. 5c is a cross-sectional view taken along the line Y-Y in FIG. 5b.

The third embodiment of the semiconductor light emitting element having a ridge waveguide comprises a semiconductor substrate 51, an active layer 53 formed above the semiconductor substrate 51 and between SCH layers 52a, 52b which are formed above and below the active layer 53, a cladding layer 54 formed on the SCH layers 52a, a contact layer 55 formed on the cladding layer 54, a first insulating film 56 formed on the contact layer 55, a first electrode 57a formed on the first insulating film 56, and a second electrode 57b formed below the semiconductor substrate 51.

A ridge section comprising a plurality of layers including the above mentioned cladding layer 54 is formed above the active layer 53. A part of the first insulating film 56 is removed in the ridge section, so that the contact layer 55 contacts the first electrode 57a in the ridge section.

The two end facets perpendicular to the length direction of the semiconductor light emitting element are formed by cleavage. The active layer 53 opens on one end facet 58a among the two end facets so that the active layer 53 makes a predetermined angle to the normal direction of the one end facet 58a, and the active layer 53 opens perpendicularly on the other end facet 58b among the two end facets. A partially heating means 59 for heating a predetermined length portion of the active layer 53 along the direction of light propagation is formed on the first electrode 57a at a position which is thermally isolated from the one end facet 58a and is close to the other end facet 58b. The partially heating means 59 comprises a second insulating film 591, a thin film resistor 592 formed on the second insulating film 591, and at least two terminal sections 593 for supplying electrical power to the thin film resistor 592.

In general, the semiconductor light emitting element having a ridge waveguide as described in this embodiment can easily store the heat in its waveguide, compared with the semiconductor light emitting element having a buried heterostructure as described in the first or second embodiment. Therefore, the semiconductor light emitting element of this embodiment is more effective than that of the first or second embodiment.

Note that the predetermined angle to the normal direction of the one end facet 58a and the structure of insulating films are similar to those in the first embodiment.

As described above, the semiconductor light emitting element of the third embodiment of the present invention can improve the heating efficiency of the predetermined length portion of the active layer by having a ridge waveguide.

Fourth Embodiment

The fourth embodiment of a semiconductor light emitting element according to the present invention is shown in FIG. 6. This embodiment of the semiconductor light emitting element has a buried heterostructure similar to the first embodiment except that the active layer 12 opens on the two end facets formed by cleavage so that the active layer 12 makes predetermined angles to the normal direction of the each end facet.

The partially heating means 15 is formed at a position thermally isolated from the two end facets, that is, approximately at the center of the element, so that the partially heating means 15 does not affect the light emitted from the two end facets. Other structures of the partially heating means 15 are similar to the first embodiment.

By utilizing such a configuration, it becomes possible to make the directions of light emission at the two end facets to be parallel with each other or to make the relative angle of light emission at the two end facets to be oscillation at desired angles. A high-reflection coating of a multilayer dielectric film may be applied on one of the two end facets so that the one of the two end facets serves as a reflective surface. The reflectivity at the end facet (hereafter referred to as "oblique end facet") on which the active layer opens so that the active layer makes a predetermined angle to the normal direction of the end facet depends on the spot size of the light. Because of the fact that the reflectivity is lowered by increasing the spot size, it is possible to form the oblique end facet serving as a reflective surface by forming the waveguide structure in which the spot size near the oblique end facet is small, without lowering the reflectivity too much.

As for the semiconductor light emitting element, as shown in FIG. 6b, in which the active layer 12 is linearly arranged and oriented obliquely relative to the length direction of the element, and the active layer 12 opens on the two end facets so that the active layer 12 makes predetermined angles to the normal direction of the each end facet, it becomes possible to make the difference between the reflectivity of the two end facets by using a high-reflection coating of a multilayer dielectric film and controlling the spot size of the waveguide, similar to the description regarding the structure shown in FIG. 6a.

In either case, by employing the structure where the heating does not affect the oblique end facet, it becomes possible to control the directions and the phase of the light emitted from the oblique end facet separately.

It is necessary to broaden the distance between the oblique end facet and the edge of the partially heating means 15 to such an extent, so that the heating does not affect the oblique end facet. For example, the distance is more than 50 μm, and is ideally the same as the thickness of the element.

Note that, it is possible that recessed sections may be formed at both lateral sides of the active layer as shown in the second embodiment, and that the semiconductor light emitting element having a ridge waveguide as shown in the third embodiment may include the structures of this embodiment.

As described above, the semiconductor light emitting element of the fourth embodiment of the present invention can make the directions of light emission at the two end facets to be parallel with each other or can make the relative angle of light emission at the two end facets to be oscillation at desired angles, because of the fact that the active layer opens on the two end facets so that the active layer makes predetermined angles to the normal direction of the each end facet.

INDUSTRIAL APPLICABILITY

As explained above, the semiconductor light emitting element according to the present invention can control the phase when applied to an external cavity laser by operating the partially heating means, and is useful as, for example, a laser for the WDM communication system. The semiconductor light emitting element according to the present invention can also broaden the width of emission spectrum when applied to a super luminescent diode by operating the partially heating means, and is useful mainly as, for example, a light source for measurement purposes.

What is claimed is:
1. A semiconductor light emitting element comprising:
a semiconductor substrate;
an active layer for emitting and propagating light, said active layer being formed in a stripe shape above said semiconductor substrate;
buried layers formed on both lateral sides of said active layer;
a cladding layer formed above said active layer and said buried layers;
a first electrode formed above said cladding layer; and
a second electrode formed below said semiconductor substrate;
wherein said active layer opens on two end facets formed by cleavage, said active layer providing optical gain over the entire length between said two end facets, said active layer making a predetermined angle to a normal direction of one end facet among said two end facets, said light being emitted from said one end facet,
said semiconductor light emitting element further comprising a partially heating means for heating a predetermined length portion of said active layer along a direction of light propagation, said partially heating means being formed on said first electrode at a position closer to the other end facet than to said one end facet, heat generated by said partially heating means being conducted to said semiconductor substrate in a direction of thickness of said semiconductor light emitting element.

2. A semiconductor light emitting element comprising:

a semiconductor substrate;

an active layer formed above said semiconductor substrate;

a cladding layer formed above said active layer;

an insulating film formed above said cladding layer;

a first electrode formed above said insulating film;

a second electrode formed below said semiconductor substrate; and a ridge section formed above said active layer;

wherein said active layer opens on two end facets formed by cleavage, said active layer providing optical gain over the entire length between said two end facets, said active layer making a predetermined angle to a normal direction of one end facet among said two end facets, said light being emitted from said one end facet, said semiconductor light emitting element further comprising a partially heating means for heating a predetermined length portion of said active layer along a direction of light propagation, said partially heating means being formed on said first electrode at a position closer to the other end facet than to said one end facet, heat generated by said partially heating means being conducted to said semiconductor substrate in a direction of thickness of said semiconductor light emitting element.

3. A semiconductor light emitting element as set forth in claim 1 or 2, wherein, said partially heating means comprises an insulating film, a thin film resistor formed on said insulating film, and at least two terminal sections for supplying electrical power to said thin film resistor.

4. A semiconductor light emitting element as set forth in claim 1 or 2, wherein, said active layer opens perpendicularly on the other end facet among two end facets formed by cleavage.

5. A tunable wavelength laser light source comprising:

a semiconductor light emitting element as set forth in claim 1 or 2;

an anti-reflection film formed on said one end facet of said semiconductor light emitting element;

an optical feedback means aligned on an optical axis of light emitted from said one end facet so as to feedback said light emitted from said one end facet to said one end facet; and a wavelength selecting means for selecting an oscillation wavelength of a laser cavity comprised of said semiconductor light emitting element and said optical feedback means, wherein said oscillation wavelength of said laser cavity is changed in response to electrical power supplied to said thin film resistor from said at least two terminal sections and a wavelength selected by said wavelength selecting means.

* * * * *